(12) United States Patent
Meyer

(10) Patent No.: US 6,472,875 B1
(45) Date of Patent: Oct. 29, 2002

(54) METHOD FOR DETECTING A MOTOR VEHICLE BATTERY FAILURE

(75) Inventor: Henry-Louis Meyer, Tournefeuille (FR)

(73) Assignee: Siemens VDO Automotive S.A.S, Toulouse-Cedex (FR)

( * ) Notice: Subject to any disclaimer, the term of this patent is extended or adjusted under 35 U.S.C. 154(b) by 0 days.

(21) Appl. No.: 09/509,966
(22) PCT Filed: Sep. 24, 1998
(86) PCT No.: PCT/EP98/06103
§ 371 (c)(1), (2), (4) Date: May 26, 2000
(87) PCT Pub. No.: WO99/17128
PCT Pub. Date: Apr. 8, 1999

(30) Foreign Application Priority Data

Oct. 1, 1997 (FR) .............................. 97 12213

(51) Int. Cl.$^7$ .............................. G01V 3/18; G01V 3/08
(52) U.S. Cl. ....................... 324/327; 324/426; 324/429; 324/431
(58) Field of Search ................................. 324/426, 430, 324/427, 431, 429; 701/29

(56) References Cited

U.S. PATENT DOCUMENTS

| | | | | |
|---|---|---|---|---|
| 3,971,980 A | * | 7/1976 | Jungfer et al. ............. 324/29.5 |
| 4,322,685 A | * | 3/1982 | Frailing et al. ............. 324/429 |
| 4,433,294 A | * | 2/1984 | Windebank ................. 324/426 |
| 4,719,427 A | * | 1/1988 | Morishita et al. ........... 324/427 |
| 4,745,349 A | * | 5/1988 | Palanismary et al. ....... 320/125 |
| 4,937,528 A | | 6/1990 | Palanisamy ................. 324/430 |
| 5,027,294 A | * | 6/1991 | Fakruddin et al. .......... 364/550 |
| 5,061,898 A | * | 10/1991 | Oram et al. ................ 324/427 |
| 5,193,067 A | | 3/1993 | Sato et al. ................... 702/63 |
| 5,432,452 A | * | 7/1995 | Fiorina et al. .............. 324/427 |

FOREIGN PATENT DOCUMENTS

| | | |
|---|---|---|
| DE | 3901680 A1 | 3/1990 |
| DE | 4341826 A1 | 6/1994 |
| EP | 0464748 A2 | 1/1992 |
| FR | 2694660 | 2/1994 |

OTHER PUBLICATIONS

Published International Application No. 91/16635 (Eriksson et al.), dated Oct. 31, 1991.

* cited by examiner

Primary Examiner—N. Le
Assistant Examiner—Wasseem H. Hamdan
(74) Attorney, Agent, or Firm—Laurence A. Greenberg; Werner H. Stemer; Ralph E. Locher

(57) ABSTRACT

A process for the detection of a defect of an automotive vehicle battery includes analyzing the time dependence of the discharge voltage across the terminals of the battery. This process has the steps of measuring at least two successive values of the discharge voltage of the battery, during the phase of cranking the engine of the automotive vehicle, for at least two consecutive top dead center points, taking a difference of the measured voltage values, and deducing therefrom whether the battery is charged or defective. The process is built into an electronic computer carried on board the automotive vehicle.

5 Claims, 2 Drawing Sheets

METHOD FOR DETECTING A MOTOR VEHICLE BATTERY FAILURE

BACKGROUND OF THE INVENTION

Field of the Invention

The present invention relates to a process for the detection of a defect of an automotive vehicle battery. More especially, the process according to the invention is intended to be built into an electronic computer carried on board an automotive vehicle, and to warn the driver of an impending defect of the battery.

A certain number of battery defect detection processes already exist. The best known processes consist in measuring the discharge voltage of the battery when the latter is disconnected from the vehicle. This is scarcely practical for regular monitoring of the state of charge of the battery.

Battery defect detection processes also exist which are built into an electronic computer carried on board a vehicle and which require no disconnection of the battery. Such a process is described for example in the document U.S. Pat. No. 4,937,528. However, the implementation of this process requires the monitoring of a considerable number of parameters and hence the addition of specific sensors, thereby correspondingly increasing the cost of production.

The document FR 2 694 660 describes, for its part, a device for detecting a defect of battery elements for a battery intended for powering an uninterruptible power supply device. Such a device is not intended to be implemented in an automotive vehicle. This document teaches however how to measure the changes in the discharge voltage of the battery over time so as to determine any signs of a defect. For this purpose, it is presupposed that the discharge voltage varies almost linearly over time. However, in the case of a battery powering an automotive vehicle, the discharge voltage of the battery during the engine starting phase is greatly disturbed by the operation of the engine. In particular, this discharge voltage is not a linear function of time. This is because the operation of the engine causes considerable oscillations of this discharge voltage during the starting phase. Hence, the straightforward tracking at determined time intervals of the changes in the discharge voltage of the battery is not directly indicative of its state of charge and the teachings of the document FR 2 694 660 are not applicable.

The document DE 3901680 describes a process for monitoring the possibility of cold starting of an internal combustion engine battery. For this purpose, it is proposed that the changes in the battery voltage be measured during the starting phase and that the state of charge of the battery be deduced from the difference between the maximum voltage and the minimum voltage measured.

However, these maximum and minimum voltages are measured at arbitrary instants of the combustion cycle, and their arithmetic difference is therefore dependent on the state of the battery and the normal fluctuations of the combustion cycle. Such a measurement process does not make it possible to circumvent the disturbances related to the combustion cycle of the engine.

SUMMARY OF THE INVENTION

The aim of the present invention is to alleviate these drawbacks and in particular to propose a process for detecting automotive vehicle battery defect during the engine cranking phase, said process being capable in particular of circumventing the disturbances related to the combustion cycle of the engine. One seeks moreover to measure the fewest possible parameters and not to use specific sensors. In the case of a slight defect (that is to say one which has not prevented the vehicle from running), it is desired that the driver nevertheless be warned of the state of low charge of the battery so as to carry out a recharge or a change of battery before the latter is completely flat.

For this purpose, the present invention relates to a process for the detection of a defect of an automotive vehicle battery of the type consisting in analyzing the time dependence of the discharge voltage across the terminals of the battery, characterized in that it consists in:

measuring at least two successive values ($U_1$, $U_2$) of the discharge voltage of the battery, during the phase of cranking the engine of the automotive vehicle, for at least two consecutive top dead center points, taking a difference of the measured voltage values, and deducing therefrom whether the battery is charged or defective.

Thus, by making measurements of the discharge voltage at well-determined instants of the engine combustion cycle, it is possible to reveal signs of battery defect, without specific sensors, and while circumventing the disturbances related to the combustion cycle of the engine. Measurement of the battery voltage is, indeed, already used in computers for controlling engine operation.

By carrying out the measurements of the discharge voltage of the battery at these specific operating points it is possible to determine very rapidly (during the few engine revolutions of the cranking phase) whether or not the battery is correctly charged. This is because the measurement of the voltage of the battery outside the starting phase is disturbed by the fact that once the engine has started, the battery is recharged by the alternator. It is therefore much more complicated to try to determine the state of charge of the battery and especially its capacity to ensure correct starting of the vehicle outside the engine cranking phase.

It will be noted that the indication of a battery defect is given by a straightforward difference between the values of the voltage at two consecutive specific operating points.

Other objects, advantages and characteristics of the invention will become further apparent from the description which follows, by way of non-limiting example, and with reference to the appended drawings, in which:

DESCRIPTION OF THE PREFERRED EMBODIMENT

We shall firstly recall what are the changes in the voltage across the terminals of a battery upon the starting of the automotive vehicle.

Figure 1:
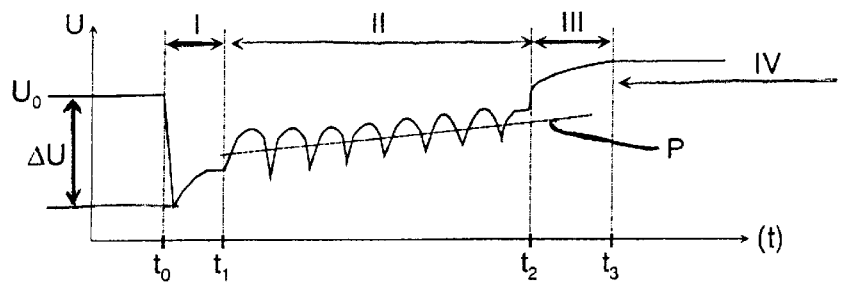
FIG. 1 is a diagrammatic view representing the changes in the discharge voltage across the terminals of a battery during the starting and running phases, when the battery is correctly charged.

With reference to FIG. 1, before the starting of the vehicle, the voltage $U_0$ drawn by the battery is stored in memory. Thereafter, the voltage U delivered by the battery is invoked during the mechanical switch-on phase (phase I). A vertical line marks the instant $t_0$ at which the driver turns his ignition key in the ignition lock. The ignition switch of the starter has just closed, thereby causing a large current spike and a corresponding drop in the voltage across the terminals of the battery. This voltage drop $\Delta U$ is only partially related to the magnitude of the discharge of the battery and to its aging.

At the instant $t_1$ (Phase II), the starter begins to crank the thermal engine. The voltage of the battery then exhibits undulations substantially synchronized with the compressions of the engine. This engine cranking phase is therefore characterized by a series of undulations. Each of the successive minima corresponds to a compression of the thermal engine.

Once the thermal engine has started (which it does after around eight compressions, sometimes fewer), the voltage begins to rise. One is then in the engine starting phase III.

When the engine is turning sufficiently quickly, the alternator then begins to supply current and the voltage across the terminals of the battery stabilizes (the so-called stabilized running phase IV).

Depending on the phase during which the battery voltage is measured, it is readily appreciated that the measurement of the battery voltage must be interpreted differently.

According to the present invention, it has been found that during the engine cranking phase (phase II), the average slope (P) of the plurality of undulations can be of three different types. For greater clarity, this slope P has been shown diagrammatically in the drawings by a straight line P.

As is represented in FIG. 1, this slope P may be upward. In this case, the voltage minima read off for successive engine compressions (consecutive top dead center points) are increasing. Such a curve reveals a correctly charged battery.

Figure 2:
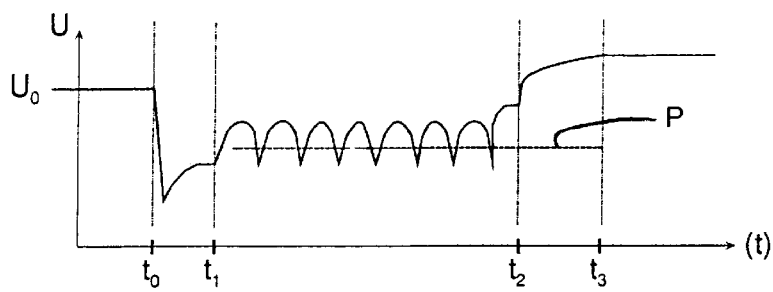
FIG. 2 is a diagrammatic view, similar to FIG. 1, for a weakly discharged or partially drained battery.

In the case of FIG. 2, it is found-that the successive minima are globally constant. The straight line P representing the slope of this curve is horizontal. Such a curve is characteristic of a weakly charged or partially drained battery. Such a battery requires at least one recharge.

Figure 3:
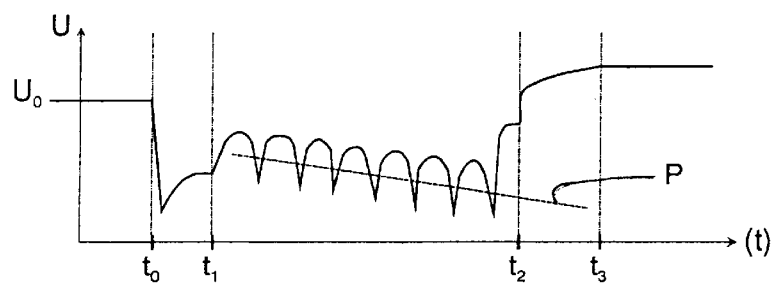
FIG. 3 is a diagrammatic view, similar to FIG. 1, for a very highly discharged or very drained battery.

In the case of FIG. 3, it is found that the successive minima are globally decreasing. The slope P of this curve is decreasing; and is characteristic of a very highly discharged or very drained battery. Such a battery must be changed and/or recharged.

Figure 4:
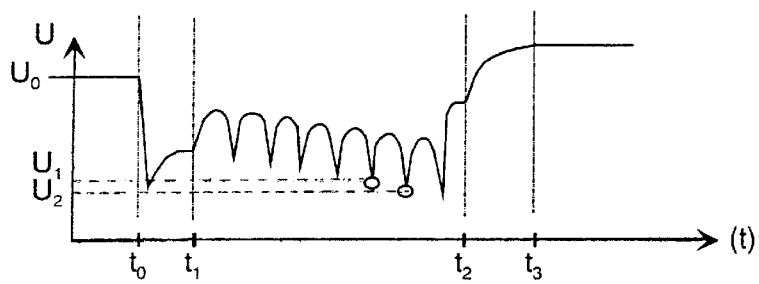
FIG. 4 illustrates a defect detection process, according to the invention, in the case of a very highly discharged battery, FIGS. 5a and 5b diagrammatically illustrate respectively the changes in the voltage of a battery and the changes in the moving average of this same voltage.
Figure 6:
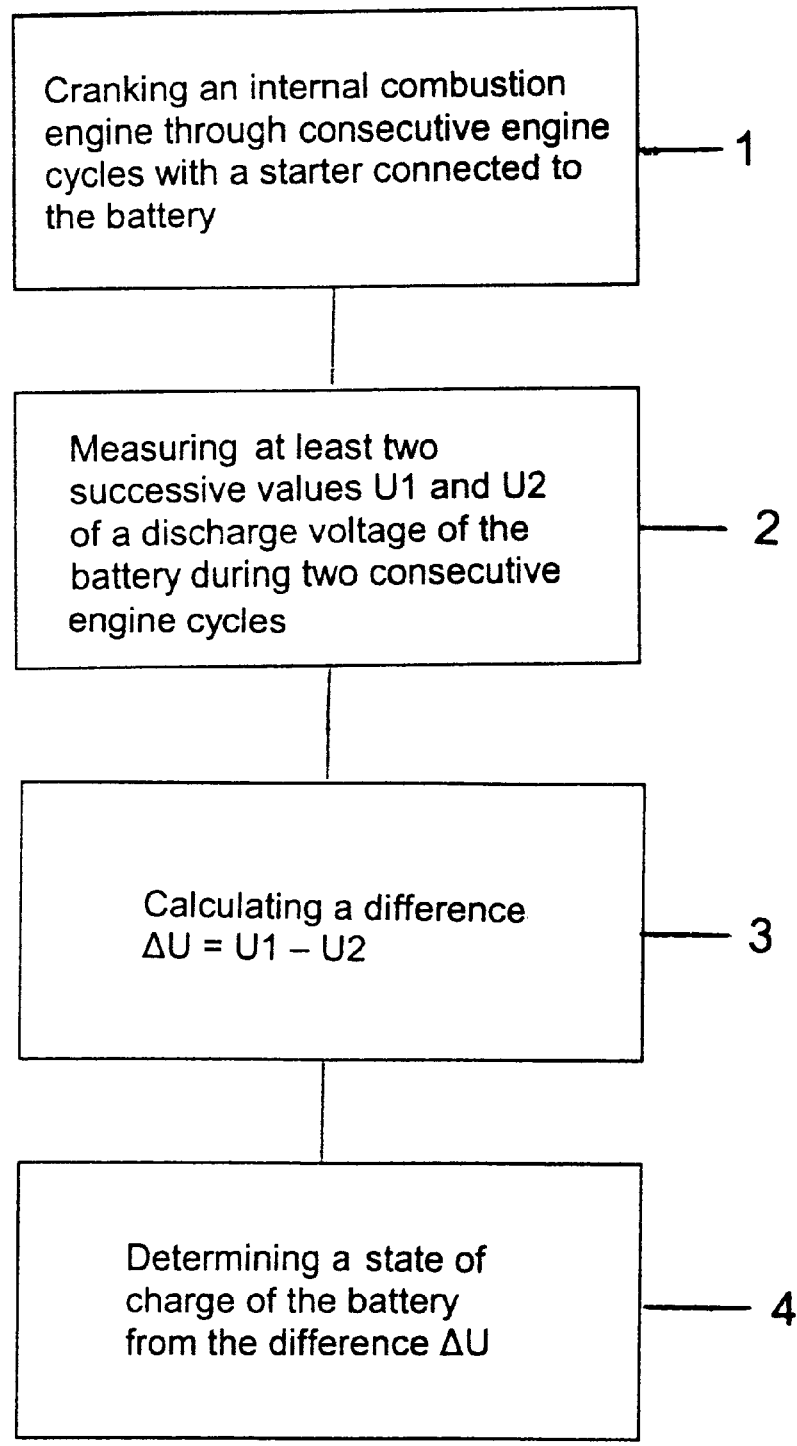
FIG. 6 is a block diagram showing the process for detecting a defect in a battery of an automotive vehicle according to the present invention.

Having regard to the facts illustrated in FIGS. 1 to 3, the defect detection process according to the invention is now described with reference to FIGS. 4 and 6:

in step 1, cranking an internal combustion engine through consecutive engine cycles with a starter connected to the battery;

in step 2, measuring at least two successive values U1 and U2 of a discharge voltage of the battery during two consecutive engine cycles;

in step 3, calculating a difference $\Delta U = U1 - U2$ between the measured voltage values; and in step 4, determining a state of charge of the battery from the difference $\Delta U$.

Indeed, when the difference is greater than zero this signifies that $U_1$ is greater than $U_2$. Now, in this case, the slope P is decreasing. One therefore has the case represented in FIG. 4 and the battery is very highly discharged.

On the other hand, when the difference $U_1-U_2$ is less than zero, then $U_1$ is less than $U_2$ and the slope P is increasing. In this case (represented in FIG. 1), the battery is correctly charged.

Finally, in the case where the difference $U_1-U_2$ is zero, it is because $U_1$ is equal to $U_2$. The slope of the curve is therefore zero (horizontal straight line) and the battery is regarded as weakly charged and as requiring a recharge.

Thus, by simply making measurements of the discharge voltage at two successive top dead center points, it is possible to plot a curve whose slope P is representative of the degree of charge of the battery.

Figure 5A:
Figure 5B:
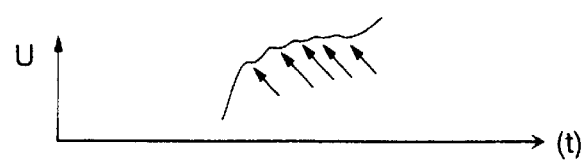

As a variant (FIGS. 5a and 5b), it is possible to plot the moving average of the voltage measured across the terminals of the battery. This average is represented in FIG. 5b. In this case, when the first derivative of this average is less than or equal to zero, there is detection of a battery defect.

The analysis of this average is carried out in a conventional manner as regards the obtaining of the first and second derivatives and will not be detailed here.

By using the moving average of the measured voltage, one in fact performs a filtering of the measurements of the voltage so that the undulations due to the engine compressions during the cranking phase II are minimized. It is recalled that the moving average of the voltage is an average taken over the N measurement points of the instantaneous voltage preceding the present measurement.

It will be noted that it is moreover possible to confirm a previously detected battery defect if the average of the discharge voltages during the cranking phase is less than a predetermined threshold as a function of a battery temperature.

Likewise, the battery can be declared to be "old" if the battery is declared defective and if an average of the discharge voltages during the cranking phase is less than a predetermined threshold as a function of temperature, and in this case, the driver is preferably informed that he will have to change the battery shortly.

It will be noted that measurement of the voltage $U_0$ produced by the battery before ignition already makes it possible to determine whether the battery is flat or old. Indeed, if this voltage $U_0$ is less than determined thresholds, it may be assumed that a fault (discharged, drained) exists. On the other hand, when the voltage $U_0$ is greater than the determined thresholds, this does not automatically signify that the battery is in good condition. In this case, the process according to the invention makes it possible to continue the analysis and to detect hidden faults of charging or of old age. It is possible to provide for boosted recharging while the vehicle is traveling, when a charging fault (even a slight one) has been revealed by the process according to the present invention. This boosted recharging is carried out by appropriate control of the alternator for example and may or may not be associated with a limiting of the consumption of the accessories (heating, car radio, etc.).

Of course, the present invention is not limited to the embodiments described hereinabove. Thus, the battery voltage could be measured at other specific points of the engine cycle. What is important here is to carry out consecutive measurements of the battery voltage at corresponding instants of at least two consecutive engine cycles.

LIST OF REFERENCES USED $U_1$ first measurement of battery voltage
$U_2$ second measurement of battery voltage
$\Delta U$ voltage drop on ignition
$t_0$ instant or vehicle ignition is achieved $t_r$ begin engine cranking
$t_2$ begin engine starting
$t_3$ stabilized running
phase I ignition phase
phase II engine cranking phase
phase III starting phase
phase IV stabilized running phase

What is claimed is:

1. A process for detecting a defect in a battery of an automotive vehicle with an internal combustion engine and an electric starter wired to the battery of the vehicle for cranking the engine during a cranking phase, the process which comprises:

cranking an internal combustion engine through consecutive engine cycles with a starter connected to the battery;

measuring at least two successive values U1 and U2 of a discharge voltage of the battery during two consecutive engine cycles;

calculating a difference $\Delta U = U1 - U2$ between the measured voltage values;

determining a state of charge of the battery from the difference $\Delta U$;

calculating a moving average of the measured discharge voltages (U1; U2); and deducing that the battery is defective if the first derivative of the average is less than or equal to zero.

2. The process according to claim 1, which comprises measuring the two successive values U1 and U2 at consecutive top dead center points of the engine.

3. The process according to claim 1, wherein the determining step comprises declaring the battery defective if the difference $\Delta U$ of the measured voltages is less than or equal to zero.

4. The process according to claim 1, which comprises confirming that the battery is defective if an average of the discharge voltages during the cranking phase is less than a predetermined threshold as a function of a battery temperature.

5. The detection process according to claim 1, which comprises:

declaring that the battery is "old" if the battery is declared defective and if an average of the discharge voltages during the cranking phase is less than a predetermined threshold as a function of temperature; and informing the driver of the vehicle that the battery will have to be changed shortly.

* * * * *